United States Patent [19]

Takenouchi et al.

[11] 4,365,274

[45] Dec. 21, 1982

[54] ONE-DIMENSIONAL IMAGE SENSOR

[75] Inventors: Mutsuo Takenouchi; Shigeru Sadamatsu, both of Ebina, Japan

[73] Assignee: Fuji Xerox Co., Ltd., Tokyo, Japan

[21] Appl. No.: 140,910

[22] Filed: Apr. 16, 1980

[30] Foreign Application Priority Data

Apr. 24, 1979 [JP] Japan .................................. 54-49701

[51] Int. Cl.³ .............................................. H04N 1/10
[52] U.S. Cl. ..................... 358/293; 358/213; 29/572
[58] Field of Search ............ 358/293, 213; 29/572, 29/576 R

[56] References Cited

U.S. PATENT DOCUMENTS 4,064,533  12/1977  Lampe et al. ................... 358/213
4,271,435   6/1981  Takenouchi et al. ............ 358/213

Primary Examiner—Richard Murray
Attorney, Agent, or Firm—Sughrue, Mion, Zinn, Macpeak & Seas

[57] ABSTRACT

A one-dimensional image sensor such as may be used in scanning an original document for use in a copying system and a method for producing the sensor. Integrated drive circuit elements are formed in a relatively small region of a monocrystalline semiconductor substrate. Lead electrodes are formed on the surface of the substrate diverging outwardly from the drive circuit elements. The lead electrodes have at end portions picture element size belt-shaped electrodes. A photoconductive non-crystalline film is formed over the belt-shaped electrodes with a wide transmissive electrode layer provided over the photoconductive non-crystalline film layer.

11 Claims, 7 Drawing Figures

ONE-DIMENSIONAL IMAGE SENSOR

BACKGROUND OF THE INVENTION

The present invention relates to one-dimensional image sensors in which the image of a handwritten, typewritten or printed original document is converted into a time series electrical signal.

At the present, for long distance transmission of images of ordinary business papers, a typical signal transmitting device is constructed of photoelectric conversion elements such as PDA's (photodiode arrays) or CCD (charge coupled device) image sensors.

FIG. 1 is a basic circuit diagram of a PDA which is commercially available. The PDA, as shown in FIG. 1, includes photodiode $PD_1$, $PD_2$, . . . and $PD_n$, MOS FET switches $S_1$, $S_2$, . . . and $S_n$, a load resistor R, and a DC source V. The switches $S_1$, $S_2$, . . . and $S_n$ have gate electrodes $V_{G1}$, $V_{G2}$, . . . $V_{Gn}$, respectively. As is well known in the art, the light and dark areas picture elements determine the presence or absence of voltages applied to the gate electrodes. The supply of the gate voltage signals is controlled by clock pulse signals on lines 1 and 2 and a shift register $S_R$.

The operating principle of the PDA of FIG. 1 will be briefly described. This discussion applies also to an image sensor according to the invention as described in detail below. FIG. 2 is an equivalent circuit of the PDA for a single picture element. An optical switch PD and a pn junction capacitor represent the equivalent circuit of a photodiode. In FIG. 2, reference character SW designates a scanning MOS FET switch and reference character R a load resistor.

When a reverse bias voltage V is applied to the photodiode PD with the switch SW closed, the pn junction capacitor $C_j$ is charged to a level $Q=C_jV$. When the PDA is irradiated by light having a brightness L for a period of time T with the switch SW opened thereafter, an amount of charge $Q'=ILT$ is discharged from the capacitor $C_j$ where the sensitivity of the photodiode is I A/lux. When the switch SW is closed to again supply the voltage V, the capacitor $C_j$ is charged to Q' again. The recharging current flows through the resistor R producing a voltage drop which forms the image signal. The above described operation is repeatedly carried out to provide a continuous time-series signal.

The above-described PDA or CCD image sensor is made up of high density picture elements. The array length is typically very short, usually not more than 30 mm. Therefore, a PDA or CCD image sensor cannot be used to read ordinary clerical or business papers without employing a contracting optical system 11 as shown in FIG. 3. Therefore, a conventional PDA or CCD image sensor is necessarily bulky. In FIG. 3, reference numeral 10 designates an integrated image sensor such as a PDA or CCD image sensor and reference numeral 12 an original document.

In order to eliminate the above-described difficulty, a reading device as shown in FIG. 4 has been proposed in the art. In this device, a photoconductive film light receiving element 6 extending over the width of an original and an integrated drive circuit element 16 are employed as an image sensor while a self-focusing lens 14 is employed as 1:1 image forming optical system. The image sensor 13 is illustrated in FIG. 5 in detail. In FIG. 5, reference numeral 17 designates an insulating substrate, 18 belt-shaped electrodes each having a width corresponding to a picture element size, 19 a photoconductive film, 20 a light transmissive electrode, 21 and IC chip including drive circuit elements 16 such as switching elements (corresponding to the switches $S_1$, $S_2$, . . . $S_n$ in FIG. 1), 22 connecting leads, and 23 wire bondings. In this device, the dimensions of the light receiving element section are relatively large. However, the overall size is much smaller than that of the system shown in FIG. 3.

A device of this type is nonetheless disadvantageous in that wire bondings are required to connect the leads of the IC chip to the external leads on the substrate 17 as shown in FIG. 5 thus requiring a great deal of manufacturing time so that the device is accordingly expensive. Furthermore, as it is necessary to connect the IC chip to the conductors on the insulating substrate with thin wires or with the use of a thermal pressure adhesion technique, the manufacturing yield of the device is relatively low and, accordingly, the device is high in manufacturing cost and low in reliability.

Accordingly, a first object of the present invention is to provide a one-dimensional image sensor which is simple to manufacture and high in manufacturing yield.

A second object of the invention is to provide a one-dimensional image sensor large in size, low in manufacturing cost and free from mechanical wiring.

A third object of the invention is to provide a one-dimensional image sensor in which optical sensitivity distribution such as for instance complementary for inadequate blue light sensitivity, as is peculiar to a PDA or CCD image sensor, is readily achieved.

A fourth object of the invention is to provide a one-dimensional image sensor large in size thereby permitting the use of a self-focusing lens optical system so as to reduce the overall size of a reading device using the invention.

SUMMARY OF THE INVENTION

These, as well as other objects of the invention, are met by a one-dimensional image sensor including integrated drive circuit elements formed in a relatively small region of a semiconductor monocrystalline substrate with lead electrodes extending divergingly from the drive circuit elements outwardly upon the same surface of the substrate upon which the drive circuit elements are formed. The lead electrodes are formed with picture element size belt-shaped electrodes at end portions thereof. A photoconductive non-crystalline film is formed over the substrate in regions covering the belt-shaped electrodes. A light transmissive electrode layer is provided over the photoconductive non-crystalline film.

A method for producing such a one-dimensional image sensor is also disclosed. According to this method, the lead electrodes are provided by diffusing impurities of the opposite conductivity type as the substrate into this substrate. The photoconductive non-crystalline film is preferably formed by a vacuum evaporation process while the formation of the light transmissive electrode layer is preferably accomplished with a three-step sputtering process.

DESCRIPTION OF THE PREFERRED EMBODIMENTS

Figure 6:
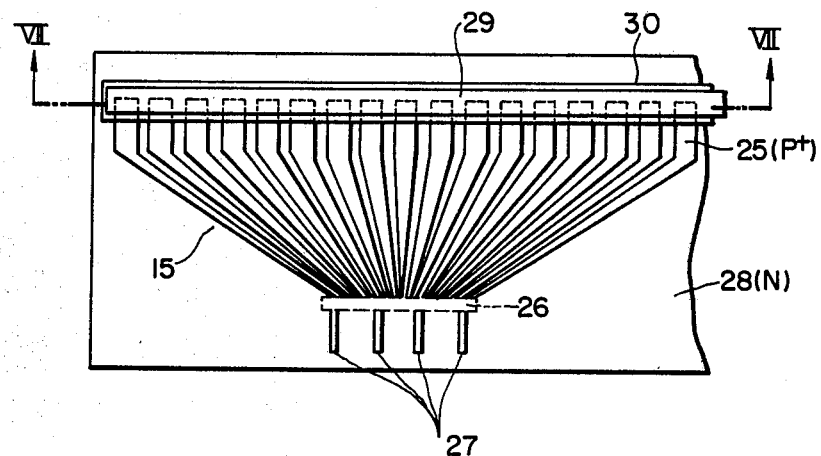
FIG. 6 is a plan view showing an preferred embodiment of a one-dimensional image sensor according to the invention.
Figure 7:
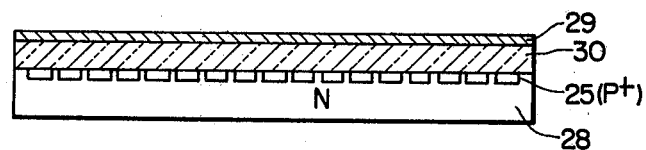
FIG. 7 is a sectional view taken along line VII—VII in FIG. 6.

A preferred embodiment of a one-dimensional image sensor according to the invention will be described with reference to FIGS. 6 and 7. FIG. 6 is a plan view of the image sensor according to the invention, and FIG. 7 is a sectional view taken along the line VII—VII in FIG. 6.

Depending on the size of the semiconductor monocrystalline substrate to be used, it may be necessary in order to construct a one-dimensional image sensor having a width equal to the width of an original by providing two or three semiconductor moncrystalline substrates. However, the electrical connections for the case of multiple substrates is completely the same as that for the case of a single substrate. Therefore, the image sensor according to the invention will be described with reference to the case where only a single substrate is employed.

Figure 1:
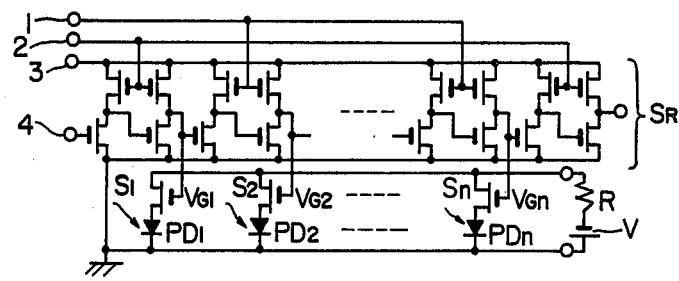
FIG. 1 is an electrical circuit diagram showing the basic circuit constructed of a conventional PDA device.
Figure 2:
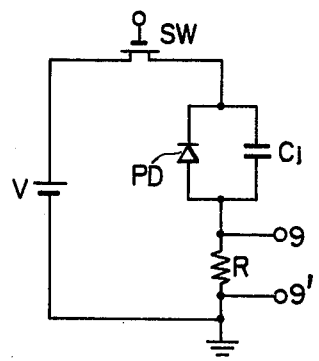
FIG. 2 is an equivalent circuit of a single picture element of the PDA.
Figure 3:
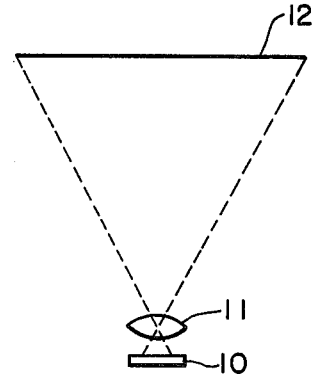
FIG. 3 is an explanatory diagram showing a reading device using a conventional small, one-dimensional image sensor.

A substrate 28 is constructed of an N-type silicon monocrystalline material which is available commercially. According to a conventional well-known semiconductor manufacturing technique, the shift register $S_R$ and the series of switches $S_1, S_2, \ldots$ and $S_n$ shown in FIG. 1 are formed as integrated drive circuit elements 26 while simultaneously a wiring pattern 27 for a clock signal, a power supply, a start signal and output terminals are formed. Lead electrodes 15 extend in a divergent manner from the source electrodes of the switches $S_1, S_2, \ldots$ and $S_n$. A picture element-size belt-shaped electrode 25 is formed at the end of each lead electrode 15. The electrodes 25 are each of equal width and are arranged at equal intervals over the entire width of the substrate 28 as illustrated in FIG. 6 and 7. The lead electrodes 15 and the belt-shaped electrodes 25 are formed of a P+ layer which is diffused into the surface layer of the substrate 28.

One of the specific features of the invention resides in that, as is apparent from FIG. 6, the drive circuit elements 26 are confirmed to a relatively small region while the belt-shaped electrodes 25 are distributed over a relatively large region.

As was described above, the P+ layer formed in the N-type silicon substrate 28 provides the belt-shaped electrodes 25. In this connection, it is desirable that the belt-shaped electrodes 25 be so designed that the ratio of the electrode width d to the gap g between adjacent electrodes is as large as possible in the light receiving portion. As the ratio d/g is increased preferably to 3 or more, the distortion of the reading signals is reduced and the generation of false signals is prevented. In other words, a high resolution is thereby provided. The resolution characteristics generally are improved in proportion to the ratio.

On the light receiving portions of the belt-shaped electrodes 25, a non-crystalline film 30 of photoconductive material, for instance, Se-Te-As, CdSe or CdS, is formed to a thickness of 0.5–5 μm by vacuum evaporation. A light transmissive electrode 29 is formed on the film 30. The light transmissive electrode 29 is preferably a so-called ITO film, a compound film of $In_2O_3$ and $SnO_2$, deposited by means of a magnetron-type DC sputtering device. In such a sputtering-type film forming system using a magnetron-type DC sputtering device, the temperature of the substrate is never increased to higher than 60° C. during the film forming operation. Therefore, the sputtering-type film forming system can be applied to the present invention even in the case where a Se-Te-As photoconductive material having a low melting point is employed which was previously not possible. It is preferable that the transmissivity of the light transmissive film electrode 29 be higher than 75% and the sheet resistance be lower than several hundreds of ohms.

Figure 4:
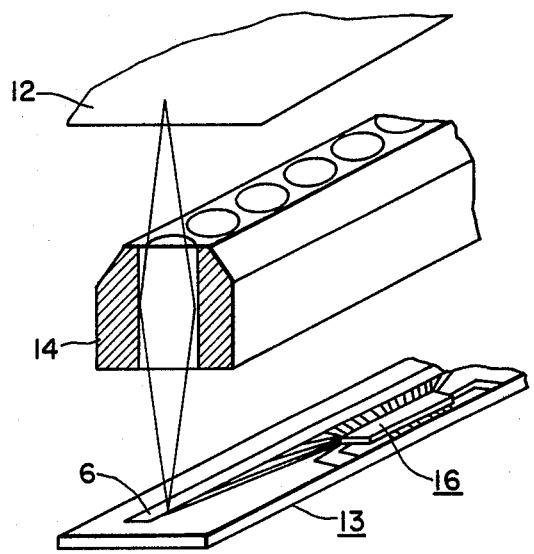
FIG. 4 is an explanatory diagram showing a reading device using a self-focusing lens.
Figure 5:
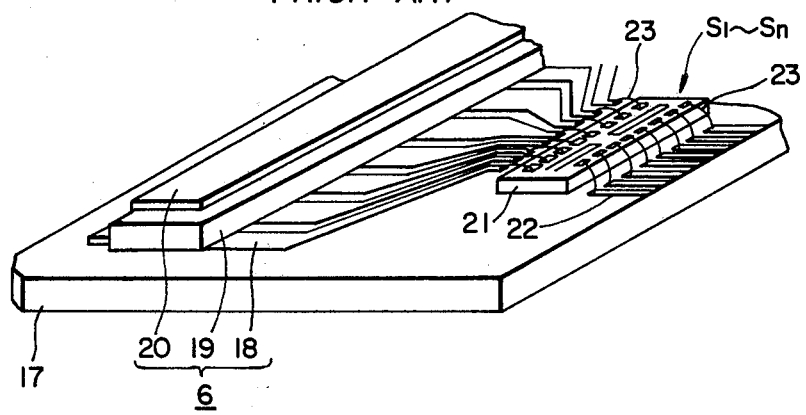
FIG. 5 is a perspective view showing a conventional image sensor having a width equal to the width of an original.

The one-dimensional image sensor thus manufactured is quite suitable for use in a reading device as shown in FIG. 4. In this case, similar to the conventional image sensor, the image of the original 12 is formed on the one-dimensional image sensor (FIG. 6). The image thus formed results in the production of a corresponding a time series signal produced line-by-line with a resolution which is matched to the feeding speed of original documents as in the accumulation mode reading system described before. The image of the original is reproduced by applying the time series signals to a heat-sensitive recording device, an ink jet device, or a multi-needle type electrostatic recording device.

The size of the one-dimensional image sensor according to the invention shown in FIG. 6 is limited to an array length of the order of 100 mm with monocrystalline materials which are available at present. Accordingly, in order to provide an image sensor covering 210 mm corresponding to the width of a standard sheet size A4, it is necessary to employ a system in which two arrays are continuously arranged.

As is clear from FIG. 7, the belt-shaped electrode region is of a relatively large geometrical size of the order of several tens of micrometers unlike the drive circuit element section 26. The connecting end faces of the monocrystalline substrates can be readily processed using presently available photolithographic techniques so that the pattern of the belt-shaped electrodes 25 is uniform in joint regions and the distance between the electrode is regular. Therefore, even an elongated image sensor 210 mm in width can be manufactured in such a manner that no joints therein are apparent.

If the reading device as shown in FIG. 4 is provided with a one-dimensional image sensor according to the invention, the size of the reading device can be further reduced with the aid of a 1:1 image forming optical system using a self-focusing lens. As the drive circuit elements are formed on the same monocrystalline substrate as the light receiving array made from the photoconductive film, the wiring can be implemented externally. Thus, the image sensor according to the invention is high in reliability and has a long service life.

An actual one-dimensional image sensor having a structure substantially that shown in FIGS. 6 and 7 was constructed. The substrate 28 was N type silicon monocrystalline material. That is, it was a rectangular substrate cut from an N type silicon monocrystalline wafer 50 mm in diameter. The integrated drive circuit elements 26 were MOS FET's with the shift register having 320 stages. Accordingly, the number of light receiving elements in the array was 320. In the image sensor, the density of the light receiving elements was eight per millimeter and, accordingly, the array length was 40 mm. The width of each belt-shaped electrode 25 extending from the drive circuit element 26 to positions under the light receiving element was 100 μm and the distance between adjacent belt-shaped electrodes 25 was 25 μm. The wiring pattern resolution at the light receiving section was 50 μm.

A non-crystalline film of 95% Se and 5% was deposited by vacuum-evaporation to a thickness of 1.5 μm through a mask on the light receiving element section of the silicon substrate with the drive circuit elements, namely, on the electrodes 25. Thereafter, a non-crystalline film of 75% Se, 20% Te and 5% As and a non-crystalline film of 95% Se and 5% As were successively vacuum-evaporated to thicknesses of 0.3 μm of 0.05 μm, respectively, thereon. These three layers formed the photoconductive film 30.

The substrate thus processed together with a mask was placed in a sputtering chamber for the formation of the light transmissive electrode 29 and to set the light receiving section size for each picture element at a preferred value of 100 μm × 100 μm. The sputtering device was a magnetron type and the target a sintered material of $SnO_2$ and $In_2O_3$ with a composition ratio of 1/9. With the distance between the target and the substrate 120 mm, sputtering was carried out in an argon gas atmosphere at a pressure of $3.5 \times 10^{-3}$ Torr and an oxygen gas partial pressure $9 \times 10^{-5}$ Torr for six minutes. An ITO film was thus obtained forming the light transmissive electrode. The light transmissive electrode had a transmissivity of 80% and a sheet resistance of 300 Ω.

As a test, the one-dimensional image sensor of the invention thus manufactured was assembled with the reading device shown in FIG. 4 and its output was applied to a storage type cathode-ray tube for display thereby. The image displayed by the storage type cathode-ray tube was found to satisfactorily coincide with the original input.

In the above-described image sensor, the shift register made up of the MOS FET's shown in FIG. 1 was employed for the integrated drive circuit elements. However, it is obvious that, similar to a commercially available CCD image sensor, the drive circuit may be of a CCD construction in which a CCD shift register transfers signal charges.

As is apparent from the above description, according to the invention, a one-dimensional image sensor can be provided which has no mechanical wiring and is therefore high in durability, low in manufacturing cost and has a high manufacturing yield. Furthermore, the drive circuit elements may be formed using integration techniques in a small region of the semiconductor substrate. Accordingly, the drive circuit elements are uniform in operating chracteristics. As the light receiving element section is provided as a vacuum-evaporation film, its size can be readily increased while uniform optical sensitivity is maintained.

What is claimed is:

1. A one-dimensional image sensor comprising: integrated drive circuit elements formed in a relatively small region of a semiconductor monocrystalline substrate; lead electrodes extending in a divergent manner from said drive circuit elements in a surface of said substrate, said lead electrodes each having a picture element size belt-shaped electrode at an end portion thereof; a photoconductive non-crystalline film formed on said substrate in a predetermined region so as to cover said belt-shaped electrodes; and a light transmissive electrode layer provided on said photoconductive non-crystalline film.

2. The one-dimensional image sensor as claimed in claim 1 wherein said lead electrodes and said belt-shaped electrodes comprise a high impurity density layer formed in said semiconductor monocrystalline substrate.

3. The one-dimensional image sensor as claimed in claim 1 wherein said light transmissive electrode layer comprises a layer of semiconductor material having a sheet resistance lower than several hundreds of ohms.

4. The one-dimensional image sensor as claimed in claim 1 wherein said integrated drive circuit elements comprise a charge coupled device.

5. The one-dimensional image sensor as claimed in claim 1 wherein said integrated drive circuit elements comprise a shift register device.

6. The one-dimensional image sensor as claimed in claim 1 wherein said semiconductor monocrystalline substrate comprises a substrate of N semiconductor material.

7. The one-dimensional image sensor as claimed in claim 6 wherein said belt-shaped electrodes comprise p+ semiconductor material.

8. A method for producing a one-dimensional image sensor comprising the steps of: providing a monocrystalline semiconductor substrate; forming integrated drive circuit elements in a relatively small region of said semiconductor monocrystalline substrate; forming lead electrodes extending from said drive circuit elements in a divergent manner upon a surface of said substrate, said lead electrodes having picture element size belt-shaped electrodes at end portions thereof; forming a photoconductive non-crystalline film on said substrate in a predetermined region so as to cover said belt-shaped electrodes; and forming a light transmissive electrode layer on said photoconductive non-crystalline film.

9. The method of claim 8 wherein said step of forming said lead electrodes comprises forming regions of a conductivity opposite that of said substrate on said surface of said substrate.

10. A method for producing a one-dimensional image sensor comprising the steps of: providing a monocrystalline semiconductor substrate; forming integrated drive circuit elements in a relatively small region of said semiconductor monocrystalline substrate; forming lead electrodes extending from said drive circuit elements in a divergent manner upon a surface of said substrate, said lead electrodes having picture element size belt-shaped electrodes at end portions thereof; forming a photoconductive non-crystalline film on said substrate in a predetermined region so as to cover said belt-shaped electrodes by depositing by vacuum evaporation a non-crystalline film consisting of 95% Se and 5% As, depositing by vacuum evaporation a film consisting of 75% Se, 20% Te and 5% As, and depositing by vacuum evaporation a film consisting of 95% Se and 5% As; and, forming a light transmissive electrode layer on said photoconductive non-crystalline film.

11. A method for producing a one-dimensional image sensor comprising the steps of: providing a monocrystalline semiconductor substrate; forming integrated drive circuit elements in a relatively small region of said semiconductor monocrystalline substrate; forming lead electrodes extending from said drive circuit elements in a divergent manner upon a surface of said substrate, said lead electrodes having picture element size belt-shaped electrodes at end portions thereof; forming a photoconductive non-crystalline film on said substrate in a predetermined region so as to cover said belt-shaped electrodes; and forming a light transmissive electrode layer on said photoconductive non-crystalline film by sputter depositing an ITO film.

* * * * *